United States Patent
Redecker

(10) Patent No.: US 7,294,964 B2
(45) Date of Patent: Nov. 13, 2007

(54) DISPLAY USING A PHOTOLUMINESCENCE QUENCHING DEVICE, AND METHOD FOR DISPLAYING IMAGE USING THE SAME

(75) Inventor: Michael Redecker, Berlin (DE)

(73) Assignee: Samsung SDI Co., Ltd., Suwon (KR)

( * ) Notice: Subject to any disclaimer, the term of this patent is extended or adjusted under 35 U.S.C. 154(b) by 21 days.

(21) Appl. No.: 10/612,975

(22) Filed: Jul. 7, 2003

(65) Prior Publication Data
US 2004/0017148 A1   Jan. 29, 2004

(30) Foreign Application Priority Data
Jul. 23, 2002 (EP) ................................. 02090276
Feb. 12, 2003 (KR) ...................... 10-2003-0008830

(51) Int. Cl.
H01J 1/62 (2006.01)
H01J 63/04 (2006.01)

(52) U.S. Cl. ....................... 313/506; 313/504; 313/512

(58) Field of Classification Search ................ 313/504, 313/500, 501, 506, 509, 512
See application file for complete search history.

(56) References Cited

U.S. PATENT DOCUMENTS 5,834,894 A * 11/1998 Shirasaki et al. .......... 313/509
6,117,529 A * 9/2000 Leising et al. .............. 428/209
6,747,618 B2 * 6/2004 Arnold et al. ................ 345/77

FOREIGN PATENT DOCUMENTS

| EP | 0838715 | 4/1998 |
|----|---------|--------|
| JP | 07-084532 | 3/1995 |
| JP | 2000-066301 | 3/2000 |
| JP | 2000-321994 | 11/2000 |
| JP | 2002-091380 | 3/2002 |
| JP | 2005-502086 | 1/2005 |

* cited by examiner

Primary Examiner—Nimeshkumar D. Patel
Assistant Examiner—Kevin Quarterman
(74) Attorney, Agent, or Firm—H.C. Park & Associates, PLC

(57) ABSTRACT

A display which does not require color filters, has low optical losses, and is not heavy and large, and a method for displaying an image using the display includes a substrate on one side of which sub-pixels are arranged. Each sub-pixel includes two opposite electrodes and an emitter layer which is interposed between the two electrodes. The emitter layer receives the light projected from an excitation light source, and is able to radiate photoluminescence light. The photoluminescence light from the emitter layer may be controllably quenched by an electrical field formed by the electrodes.

19 Claims, 4 Drawing Sheets

DISPLAY USING A PHOTOLUMINESCENCE QUENCHING DEVICE, AND METHOD FOR DISPLAYING IMAGE USING THE SAME

CROSS REFERENCE TO RELATED APPLICATIONS

This application claims the priority of European Patent Application 02 090 276.3, filed on Jul. 23, 2002 and Korean Patent Application 2003-8830, filed on Feb. 12, 2003, which are incorporated herein in their entirety by reference.

BACKGROUND OF THE INVENTION

1. Field of the Invention

The present invention relates to a display using a photoluminescence quenching device, and a method for displaying an image using the same.

2. Description of the Related Art

Projection displays may be constructed using cathode ray tubes (CRTs) wherein an intermediate image is formed on a phosphor screen by electrical excitation and the intermediate image is projected onto a screen via an optical unit. The light intensity used by a CRT is very high, thereby reducing life span of the projection display. Also, projection displays constructed with CRTs consume a high amount of power and are relatively heavy and large.

Projection displays may also be constructed using liquid crystals. The light source used in liquid crystal projection displays typically consists of a white light lamp whose light is modulated with spatial resolution by a liquid crystal matrix. The colors are produced by color filters, and an enlarged image is obtained by mixing colors on reflecting and transmitting screens.

In some projection displays, an array of micro-mirrors may be used to modulate incident light. In this case, color filters are used for the production of required colors.

In other projection displays, such as those disclosed in EP 0 838 715 A1 and EP 0 869 388 A1, organic light-emitting diodes (OLEDs) are used as a light source. The modulation of the light intensity is achieved by a liquid crystal matrix which is located upstream of the light source. In this case, the OLED functions as a light source, similar to a back light in a liquid crystal display (LCD) and does not function as an active driving element. Brighter OLEDs are used to compensate for the optical losses caused by a polarizer and liquid crystals.

SUMMARY OF THE INVENTION

The present invention provides a display which does not require color filters, has low optical losses, and is not heavy and large, and a method for displaying an image using the same. This invention separately provides a display using a photoluminescence quenching device. The display includes a substrate with a plurality of sub-pixels arranged on at least a first side of the substrate, wherein each sub-pixel comprises a first electrode having a first polarity and a second electrode having a second polarity, and an emitter layer, wherein the emitter layer is interposed between the first electrode and the second electrode, the emitter layer receives light projected from an excitation light source, and emits photoluminescence light, and the photoluminescence light from the emitter layer may be controllably quenched by an electrical field formed by the first electrode and the second electrode.

This invention separately provides a method for displaying an image using a display using a photoluminescence quenching device. The method comprises projecting light emitted from an excitation light source on an emitter layer so that photoluminescence light is emitted from the emitter layer, controlling emission of photoluminescence light by generating an electrical field in the emitter layer, thereby quenching the photoluminescence light, and displaying an image on a screen using photoluminescence light emitted from the emitter layer.

These and other features and advantages of this invention are described in, or are apparent from, the following detailed description of various exemplary embodiments of the systems and methods according to this invention.

BRIEF DESCRIPTION OF THE DRAWINGS

The above and other aspects and advantages of the present invention will become more apparent by describing in detail exemplary embodiments thereof with reference to the attached drawings.

DETAILED DESCRIPTION OF THE INVENTION

Figure 1:
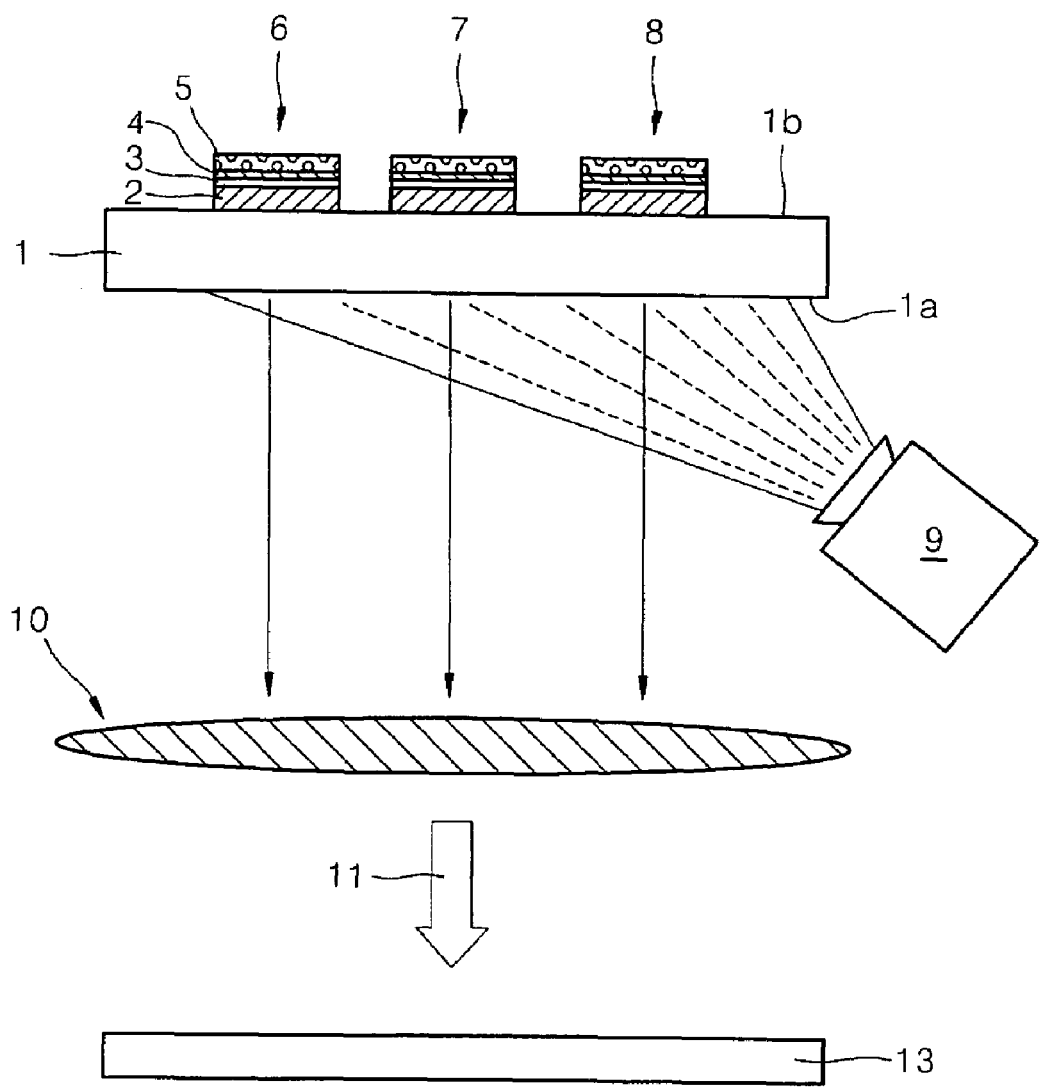
FIG. 1 schematically shows a display using a photoluminescence quenching device according to a first embodiment of the present invention.

An exemplary embodiment of the present invention will be described with reference to FIG. 1 which illustrates a display using a photoluminescence quenching device according to the present invention. The display in this exemplary embodiment includes a substrate 1 with sub-pixels 6, 7, and 8 arranged on one side thereof, and an excitation light source 9 which can project light on a front side 1a of the substrate 1.

In this exemplary embodiment, the substrate 1 is formed of a transparent material through which excitation light projected by an excitation light source can pass, and the sub-pixels 6, 7, and 8 are arranged on a rear side 1b of the substrate 1. Each of the sub-pixels 6, 7, and 8 includes two electrodes 2 and 5 and an emitter layer 4 which is interposed between the two electrodes 2 and 5. The two electrodes 2 and 5 have opposite polarities and the emitter layer 4 is able to radiate photoluminescence light.

The emitter layer 4 may, for example, be formed of a low molecular organic material or light-emitting polymer. The light-emitting polymer may, for example, be a material selected from the group comprising polyphenylene vinylene and/or the group comprising polyfluorene. Processes such as, for example, spin-coating, spraying, scrape-depositing, and ink-jet printing may be used to form the emitter layer 4.

In this exemplary embodiment, the electrode 2 located adjacent to the rear side 1b of the substrate 1 is formed of a transparent material through which excitation light can pass, and the other electrode 5 is formed of material which reflects the light emitted from the emitter layer 4. Indium tin oxide (ITO) may, for example, be used as the transparent electrode. In the present exemplary embodiment, the electrode 2 which is located adjacent to the rear side of the substrate 1 is an anode, and the other electrode 5 is a cathode. However, the polarities of these electrodes 2 and 5 may be changed.

In the various embodiments of the present invention, a hole transport layer 3, as shown in FIG. 1, which facilitates the movement of holes may be interposed between the anode 2 and the emitter layer 4. The hole transport layer 3 may be formed, for example, by dispersing polyethylene dioxy thiophene or polystyrene sulfone acid, and polyaniline by processes such as spin-coating, spraying, scrape-depositing, and ink-jet printing.

In addition, in the various embodiments of the present invention, the display may further include an optical unit 10, as shown in FIG. 1, which can adjust the light emitted from the emitter layer 4, and/or a screen onto which the light emitted from the emitter layer 4 is projected in order to form an image.

Light projected by the excitation light source 9 passes through the substrate 1 and the electrode 2 and reaches the emitter layer 4, which radiates photoluminescence light. The photoluminescence light which is radiated by the emitter layer is reflected by the electrode 5, passes through the substrate 1 and the electrode 2, and is projected in direction which the front side 1a of the substrate 1 faces. In various exemplary embodiments of the present invention, the excitation light source 9 may be an internal light source installed in the display or an external light source outside the display, such as indoor light or sunlight.

The display according to the present embodiment may operate in a photoluminescence mode where a signal voltage is converted into an electromagnetic wave and/or in a photoluminescence quenching mode where emission of light caused by photoluminescence is quenched. In the photoluminescence mode, holes injected from the anode are coupled with electrons injected from the cathode, and thus, exitons are generated. Light is emitted as the energy level of the exitons is lowered. By controlling the holes and the electrons supplied from the electrodes 2 and 5, a photoluminescence device can be actively controlled. In the photoluminescence quenching mode, an electrical field is formed in the emitter layer 4 by applying a voltage opposite to a voltage applied in the photoluminescence mode to the electrodes 2 and 5 such that quenching of light emitted by photoluminescence in the emitter layer 4 may be actively controlled.

In the photoluminescence quenching mode, excitation light is projected on the emitter layer 4, and the emitter layer 4 (particularly, exiton in the emitter layer 4) is excited. The emitter layer remains optically excited state for a predetermined amount of time (for example, for several nanoseconds), and then, light is emitted from the emitter layer via photoluminescence. As the light is emitted by photoluminescence, the excited state of the emitter layer declines. If an electrical field is formed in the emitter layer 4 while the emitter layer is in the excited state, the excited state of a charge carrier is partially separated before light is emitted by photoluminescence. Thus, the concentration of the excitation state is lowered, and the intensity of photoluminescence light is reduced. That is, in the photoluminescence quenching mode, the photoluminescence light has a maximum intensity when the opposite voltage is not applied to the electrodes 2 and 5. The intensity of photoluminescence light may be controlled by controlling the opposite voltage applied to the electrodes 2 and 5.

Light emitted from the emitter layer 4 may be adjusted by the optical unit 10 and projected onto the screen to obtain an image. Meanwhile, the display may not have the optical unit 10 and/or the screen. For example, when the display is mounted in a mobile communication unit, such as, for example, a mobile phone, the object of obtaining an image can be accomplished by an image formed on the substrate 1.

A control current for driving the photoluminescence quenching device can be maintained low because the photoluminescence quenching mode has better luminous efficiency than the photoluminescence mode. In particular, in the photoluminescence mode, the holes and the electrons supplied to the emitter layer 4 are recoupled with one another, and thus, exitons are generated. Three triplets are formed for each singlet of exiton. The triplets do not contribute to luminescence because their energy is consumed for thermal radiation. Thus, the triplets lower the luminous efficiency of the display. On the contrary, in the photoluminescence quenching mode, the exiton is generated by light projected from the excitation light source and the excited emitter layer emits light. Reverse current supplied from the emitter layer is used to quench the photoluminescence, and thus, a smaller amount of current than the photoluminescence mode is used.

Assuming that one charge carrier is needed for one exiton, in the photoluminescence mode, four charge carriers are needed for one singlet which contributes to luminescence and three triplets which do not contribute to luminescence. On the other hand, in the photoluminescence quenching mode, one charge carrier is needed to control one exiton which contributes to luminescence, and thus, a smaller amount of current than in the photoluminescence mode is used. Thus, in the photoluminescence quenching mode, the photoluminescence device with a low current may obtain an image having a proper brightness.

In the photoluminescence quenching device according to the present embodiment, light emitted by photoluminescence has colors determined according to the characteristic of each material used to form the emitter layer. Thus, in the photoluminescence quenching device according to the present embodiment, color filters are not required.

A thin film transistor may be used in a drive circuit which is suitable to control the brightness of the display. The thin film transistor may be formed of amorphous, monocrystalline, or polycrystalline silicon, and one thin film transistor is needed for each sub-pixel. The thin film transistor is directly formed on the substrate 1, and a scan drive circuit and a data drive circuit for driving the thin film transistor may be arranged, for example, orthogonally in the circumference of the substrate 1. Wirings for connecting the thin film transistor to the drive circuits may be arranged in a grid shape.

Figure 2:
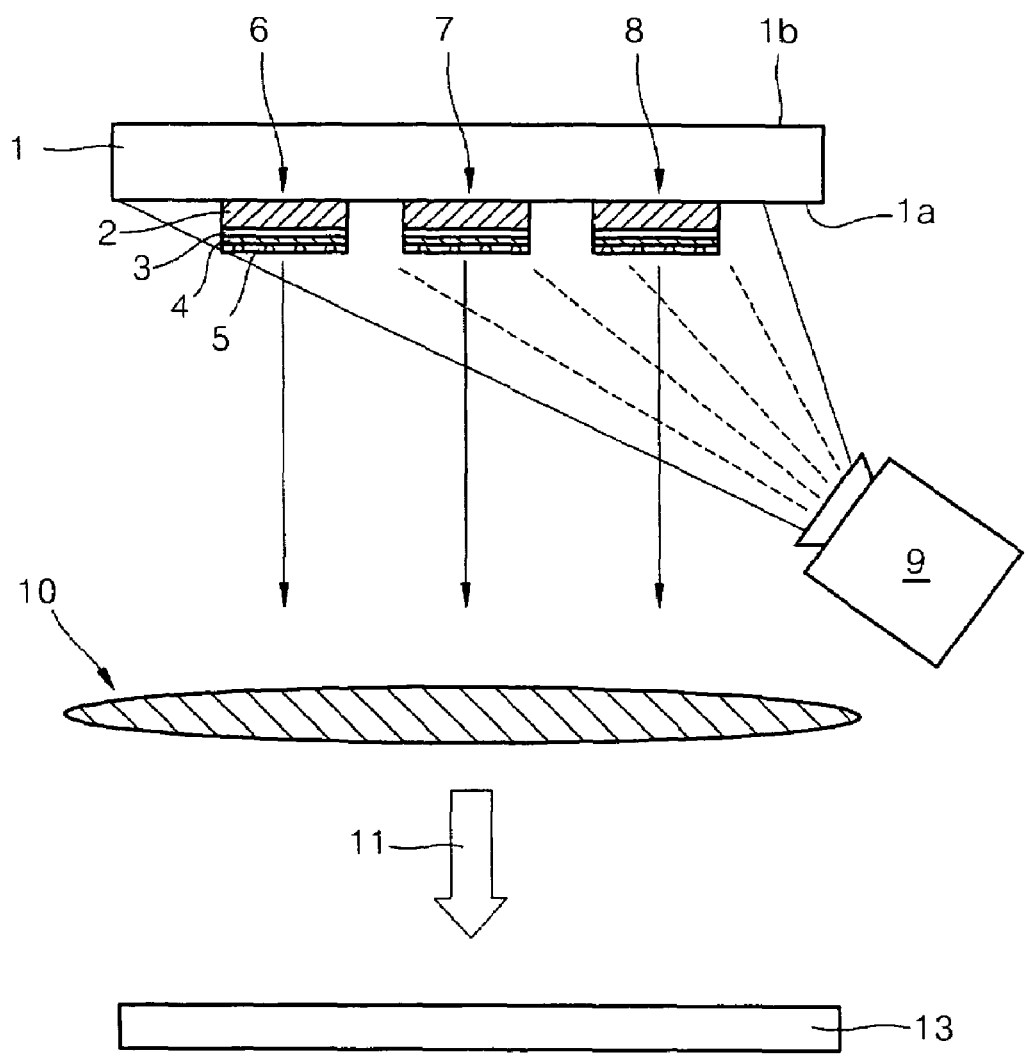
FIG. 2 schematically shows the display using a photoluminescence quenching device according to a second embodiment of the present invention.

A second embodiment of the present invention will be described with reference to FIG. 2. In the present embodiment, sub-pixels 6, 7, and 8 are arranged on a front side 1a of a substrate 1, and each of the sub-pixels 6, 7, and 8 includes two opposite electrodes 2 and 5. In one example of the second embodiment, the electrode 2 which is adjacent to the front side 1a of the substrate 1 is formed of a light-reflecting material, and the other electrode 5 is formed of a transparent material. Light is reflected by the electrode 2, and thus the substrate 1 may be formed of a comparatively nontransparent material, such as, for example, monocrystalline silicon. When the substrate 1 is formed of monocrystalline silicon, a high driving current can be obtained due to the high mobility of charge carriers on the monocrystalline silicon. As such, the brightness of the display can be improved.

Light projected from an excitation light source 9 passes through the electrode 5 and reaches an emitter layer 4. Thus, the emitter layer 4 radiates/emits photoluminescence light which is reflected by the other electrode 2. The emitted photoluminescence light passes through the electrode 5, and is projected in direction which the front side 1a of the substrate 1 faces.

In another example of the second embodiment, the substrate 1 is formed of a light-reflecting material, and the electrodes 2 and 5 are formed of a transparent material to obtain the same effect as the above-described second embodiment. Even though the substrate 1 itself is not formed of a light-reflecting material, a light-reflecting thin film may be arranged between the substrate 1 and the sub-pixels 6, 7, and 8, thereby obtaining the same effect as that of the above-described second embodiment. However, in this case, the thin film should be understood as part of the substrate 1.

A third embodiment of the present invention will be described with reference to FIG. 3. In the present embodiment, an excitation light source 9 is arranged to project light on a rear side 1b of a substrate 1, and the substrate 1 is formed of a transparent material, and sub-pixels 6, 7, and 8 are arranged on a rear side 1b of the substrate 1. A dielectric mirror 12 is arranged on the sub-pixels 6, 7, and 8. The light emitted from the excitation light source 9 passes through the dielectric mirror 12 and the dielectric mirror 12 reflects light emitted from the emitter layer 4. In this embodiment, the electrodes 2 and 5 are formed of a transparent material.

In various embodiments of the present invention, the excitation light source 9 may be, for example, a lamp with a high quota of blue light and ultraviolet rays, such as, for example, a mercury lamp and a xenon lamp.

The dielectric mirror 12 may be formed of a transparent insulating layer which allows light having wavelength in a predetermined range to pass and which reflects light having wavelength in other predetermined range. In various exemplary embodiments, the dielectric mirror 12 has a bandwidth narrower than the wavelength of light emitted from the emitter layer 4 and includes a plurality of refraction layers with different refractive indices. The optical path length of the refraction layer corresponds to one quarter of a reflection wavelength. A refraction layer with a low refractive index may be formed of materials, such as, for example, silicon dioxide, silicon nitride, magnesium fluoride, or associated materials. A refraction layer with a high refractive index may be formed of materials, such as, for example, titanium dioxide, tin oxide, zirconium oxide, or tantalic oxide.

The electrode 5 may be, for example, a thin film made of a base metal covered with a layer formed of a transparent and conductive material, such as, for example, indium tin oxide (ITO), for the purpose of increasing conductivity. The electrode 5 is stacked on the emitter layer 4. The base metal includes calcium, magnesium, barium, or aluminum. The thin film does not limit transparency because it is very thin, and increases a relatively low conductivity of the ITO. Metal fluoride, such as, for example, lithium fluoride, barium fluoride, or magnesium fluoride may be additionally stacked between the emitter layer 4 and the electrode 5. A first refraction layer of the dielectric mirror 12 may be an ITO layer. In this case, the thickness of the ITO layer should be determined to be proper for the thickness of the refraction layer.

Light projected from the excitation light source 9 passes through the dielectric layer 12 and the electrode 5, and reaches the emitter layer 4. Consequently, the emitter layer 4 emits photoluminescence light which is reflected by the dielectric mirror 12. The reflected light passes through the electrode 2 and the substrate 1, and is projected in direction which a front side 1a faces.

A fourth embodiment of the present invention will be described with reference to FIG. 4. In the present embodiment, sub-pixels 6, 7, and 8 are arranged on a front side 1a of a substrate 1, and a dielectric mirror 12 which light emitted from an excitation light source 9 passes and reflects light emitted from an emitter layer 4, is arranged between the sub-pixels 6, 7, and 8 and the substrate 1. In this embodiment, electrodes 2 and 5 are formed of a transparent material.

Light projected from the excitation light source 9 passes through the substrate 1, the dielectric layer 12, and the electrode 2, and reaches the emitter layer 4, thereby causing the emitter layer 4 to radiate photoluminescence light. Light emitted by photoluminescence in the emitter layer 4 is reflected by the dielectric mirror 12, before passing through the electrode 5, and being projected in direction which the front side 1a of the substrate 1 faces.

The present embodiment allows a process for forming the dielectric mirror 12 and the electrode 2 on the substrate 1 to be performed before the emitter layer 4, which is sensitive to process circumstances, is stacked on the substrate 1. Also, the dielectric mirror 12 may be formed of a conductive polymer material.

The above-described embodiments may be modified for enhancing photoluminescence or photoluminescence quenching by using additional means. In particular, these can be attained by using micro-lenses provided on inlet and outlet sides as well as reflection-reducing layers. In addition, a rejection filter having a wavelength corresponding to the wavelength of an excitation light may also be used. Ideally, a dielectric mirror which reflects light emitted from the excitation light source further improves a luminous efficiency.

Figure 3:
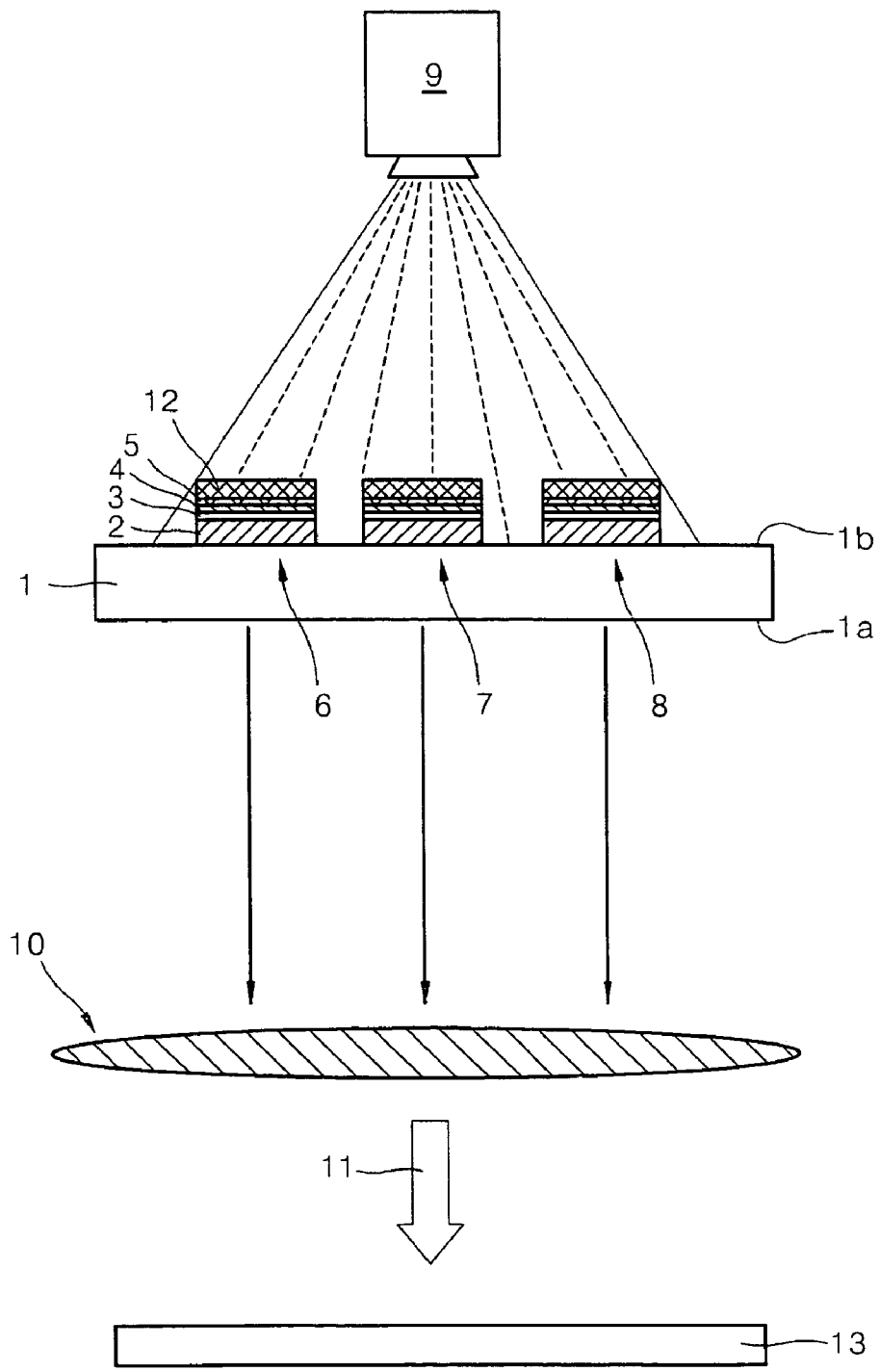
FIG. 3 schematically shows the display using a photoluminescence quenching device according to a third embodiment of the present invention.
Figure 4:
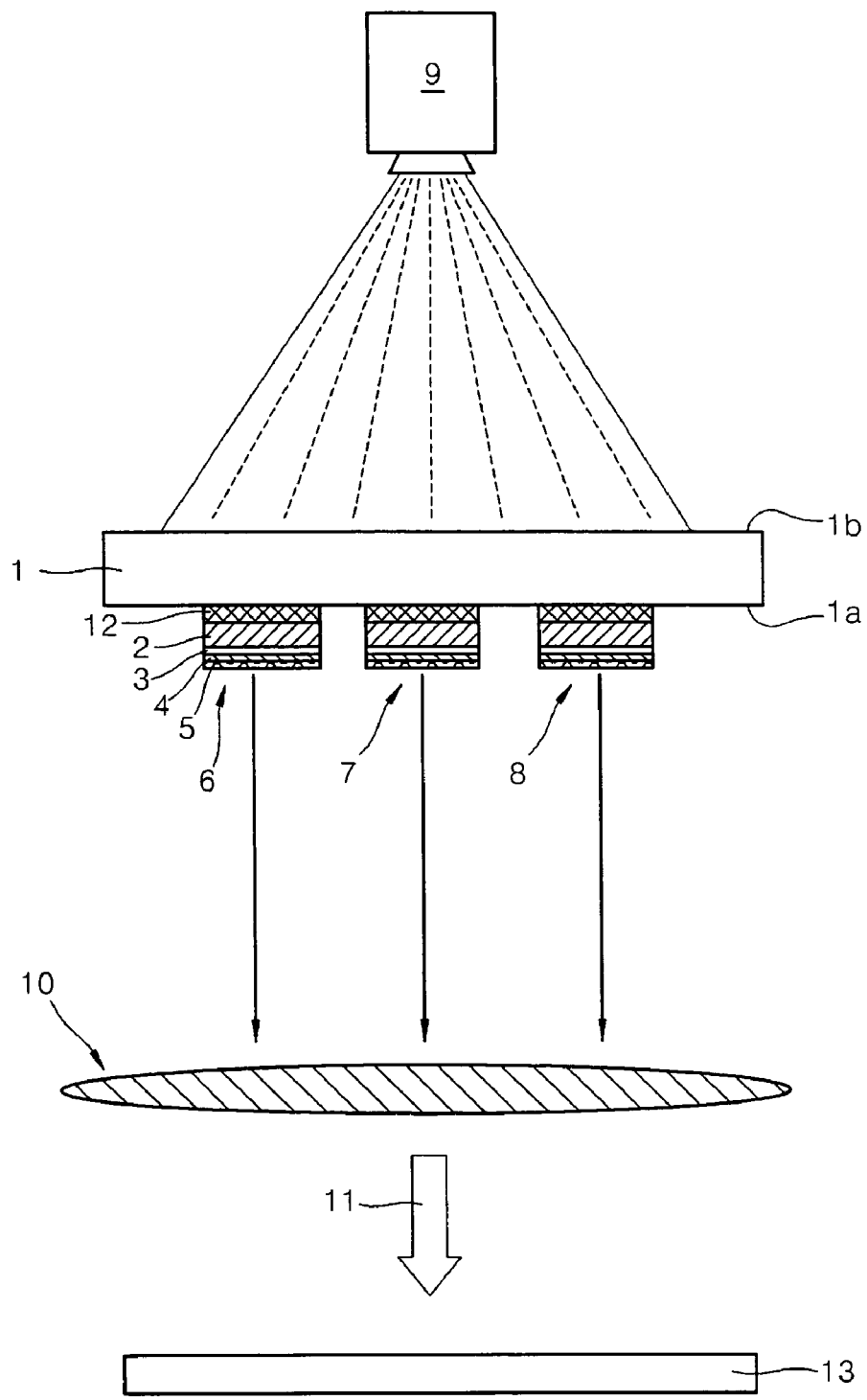
FIG. 4 schematically shows the display using a photoluminescence quenching device according to a fourth embodiment of the present invention.

In FIGS. 3 and 4, the rejection filter may be integrated into the display. In FIGS. 1 and 2, in order to ensure the injection-coupling of excitation light in the emitter layer 4, a sufficient gap from the display to the rejection filter should be maintained.

A method for displaying an image using these embodiments will be briefly described below. The method comprises steps of projecting, controlling, and displaying an image. In the step of projecting, light is projected from an excitation light source on an emitter layer so that photoluminescence light is irradiated from the emitter layer. In the step of controlling, emission of photoluminescence light is controlled by generating an electrical field in the emitter layer, thereby quenching the photoluminescence light. In the step of displaying, an image is displayed on a screen using photoluminescence light emitted from the emitter layer.

In various embodiments of the present invention, in the step of projecting, excitation light may be irradiated by a lamp which emits blue light and ultraviolet rays, such as, for example, a mercury lamp or a xenon lamp.

In various embodiments of the present invention, the step of displaying an image may comprise a substep of adjusting light emitted from the emitter layer using an optical unit. In the substep of adjusting, the light emitted from a photoluminescence device may be modulated, for example, by enlargement, reduction, refraction, or reflection, thereby determining an image to be finally displayed.

In various embodiments of the present invention, the step of displaying an image may further comprise a substep of projecting light emitted from the emitter layer onto the screen.

In various embodiments of the present invention, the substeps of adjusting and projecting should be carried out when an image to be seen by an observer is not an image formed on a substrate but an image projected onto the screen from the image formed on the substrate.

As described above, according to the present invention, a display which does not require color filters, has low optical losses, and is not heavy and large, and a method for displaying an image using the same can be provided.

While this invention has been particularly shown and described with reference to a preferred embodiment thereof, it will be understood by those skilled in the art that various changes in form and details may be made therein without departing from the spirit and scope of the invention as defined by the appended claims and equivalents thereof.

What is claimed is:

1. A display using a photoluminescence quenching device, comprising:
   a substrate with a plurality of sub-pixels arranged on at least a first side of the substrate,
   wherein a sub-pixel comprises: a first electrode having a first polarity, a second electrode having a second polarity, and an emitter layer, wherein the emitter layer is interposed between the first electrode and the second electrode;
   an excitation light source for projecting light to the emitter layer;
   a photoluminescence light emitted from the emitter layer;
   an electrical field formed between the first electrode and the second electrode which controllably quenches the photoluminescence light from the emitter layer; and
   a dielectric mirror, wherein light emitted from the excitation light source passes through the dielectric mirror, and the dielectric mirror reflects light emitted from the emitter layer toward an exterior of the display.

2. The display of claim 1, wherein the excitation light source is arranged to project light on a second side of the substrate, the substrate is formed of a transparent material, the first electrode is adjacent to the first side of the substrate, the first electrode is formed of a transparent material, and the second electrode is formed of a light-reflecting material.

3. The display of claim 1, wherein the excitation light source is arranged to project light on the first side of the substrate, the first electrode is adjacent to the first side of the substrate and is formed of a light-reflecting material, and the second electrode is formed of a transparent material.

4. The display of claim 1, wherein the excitation light source is arranged to project light on the first side of the substrate, the substrate is formed of a light-reflecting material, and the first electrode and the second electrode are formed of a transparent material.

5. The display of claim 1, wherein the excitation light source is arranged to project light on the first side of the substrate, the substrate is formed of a transparent material, the dielectric mirror is arranged on the sub-pixels, and the first electrode and the second electrode are formed of a transparent material.

6. The display of claim 1, wherein the excitation light source is arranged to project light on a second side of the substrate, the substrate is formed of a transparent material, the dielectric mirror is arranged between the sub-pixels and the substrate, and the first electrode and the second electrode are formed of a transparent material.

7. The display of claim 1, wherein the photoluminescence quenching device includes at least one of a photoluminescence mode where a signal voltage is converted into an electromagnetic wave and a photoluminescence quenching mode where emission of light caused by photoluminescence is controllably quenched.

8. The display of claim 1, wherein the emitter layer is formed of at least one of a low molecular organic material, and a light-emitting polymer, wherein the light-emitting polymer is one of polyphenylene vinylene and polyfluorene.

9. The display of claim 1, wherein a hole transport layer is interposed between the first electrode and the emitter layer, the first electrode is an anode and the hole transport layer is formed of at least one of polyethylene dioxy thiophene, polystyrene sulfone acid, and polyaniline.

10. The display of claim 1, wherein the excitation light source is a lamp which emits blue light and ultraviolet rays.

11. The display of claim 10, wherein the excitation light source is a mercury lamp or a xenon lamp.

12. The display of claim 1, wherein the excitation light source is an external light source located outside the display.

13. The display of claim 1, further comprising an optical unit which can adjust the light emitted from the emitter layer.

14. The display of claim 1, further comprising a screen on which an image is formed with the light emitted from the emitter layer.

15. The display of claim 5, wherein the dielectric mirror has a bandwidth narrower than a wavelength of the light emitted from the emitter layer.

16. The display of claim 6, wherein the dielectric mirror has a bandwidth narrower than a wavelength of the light emitted from the emitter layer.

17. The display of claim 5, wherein the dielectric mirror includes a plurality of refraction layers having different refractive indices.

18. The display of claim 6, wherein the dielectric mirror includes a plurality of refraction layers, the refraction layers having different refractive indices.

19. The display of claim 17, wherein a low-refractive index refraction layer of the plurality of refraction layers is formed of at least one of silicon dioxide, silicon nitride, and magnesium fluoride, and a high-refractive index refraction layer of the plurality of refraction layers is formed of at least one of titanium dioxide, tin oxide, zirconium oxide, and tantalic oxide.

* * * * *